United States Patent
Lin et al.

(10) Patent No.: US 8,030,146 B2
(45) Date of Patent: Oct. 4, 2011

(54) ORGANIC LIGHT EMITTING DIODE (OLED) DISPLAY PANEL AND METHOD OF FORMING POLYSILICON CHANNEL LAYER THEREOF

(75) Inventors: Jiunn-Yi Lin, Hsinchu County (TW); Ming-Yan Chen, Hsinchu County (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 12/694,957

(22) Filed: Jan. 27, 2010

(65) Prior Publication Data

US 2010/0129997 A1 May 27, 2010

Related U.S. Application Data

(62) Division of application No. 11/395,338, filed on Apr. 3, 2006, now abandoned.

(30) Foreign Application Priority Data

Dec. 1, 2005 (TW) .............................. 94142373 A

(51) Int. Cl.
H01L 21/84 (2006.01)
(52) U.S. Cl. ................. 438/162; 438/517; 257/E21.316

(58) Field of Classification Search .................. 438/159, 438/532; 257/E21.316
See application file for complete search history.

(56) References Cited

U.S. PATENT DOCUMENTS

| | | | |
|---|---|---|---|
| 5,468,974 | A | 11/1995 | Aronowitz et al. |
| 5,821,157 | A | 10/1998 | Lee et al. |
| 6,429,097 | B1 | 8/2002 | Voutsas et al. |
| 7,129,521 | B2 | 10/2006 | Shibata et al. |
| 2005/0258466 | A1 | 11/2005 | Kwak et al. |
| 2006/0263992 | A1* | 11/2006 | Chen et al. ................... 438/301 |

FOREIGN PATENT DOCUMENTS

| | | |
|---|---|---|
| JP | 6-177036 | 6/1994 |
| JP | 2002-359196 | 12/2002 |
| JP | 2003-297750 | 10/2003 |
| JP | 2005-311328 | 11/2005 |

* cited by examiner

*Primary Examiner* — Chandra Chaudhari
(74) *Attorney, Agent, or Firm* — Rabin & Berdo, PC

(57) ABSTRACT

An organic light emitting diode (OLED) display panel and a method of forming a polysilicon channel layer thereof are provided. In the method, firstly, a substrate having a polysilicon layer disposed thereon is provided. Then, a dopant atom not selected from the IIIA group and the VA group is doped inside the polysilicon layer to form a polysilicon channel layer.

5 Claims, 11 Drawing Sheets

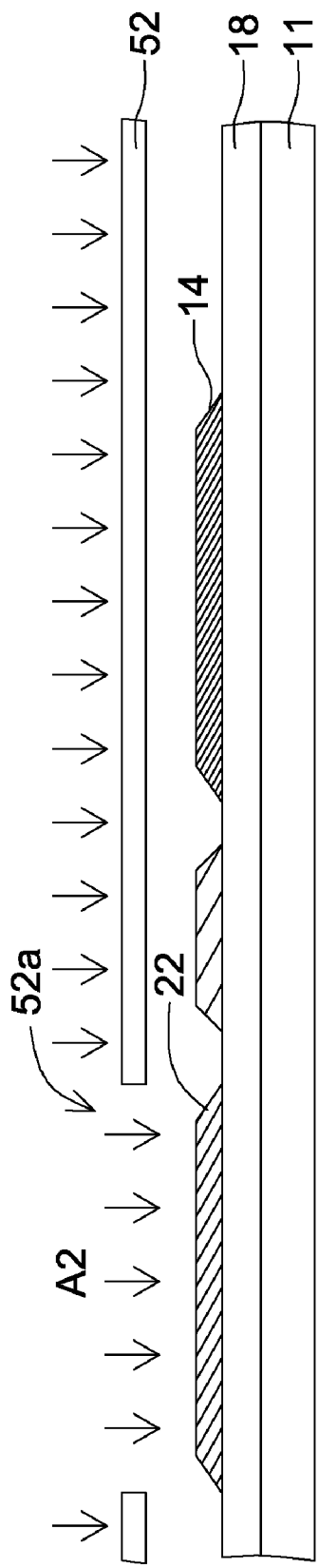
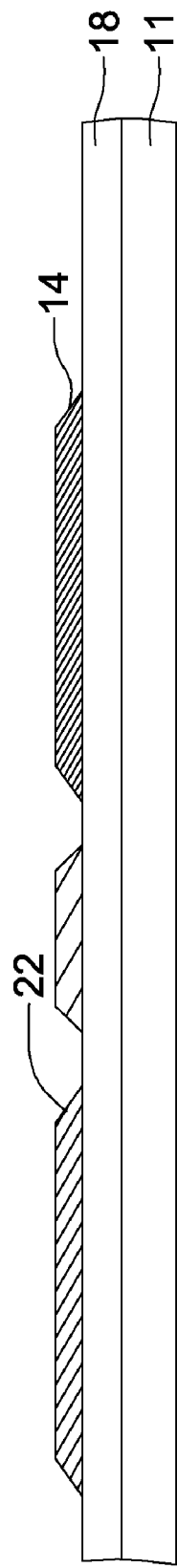
FIG. 5G
FIG. 5H

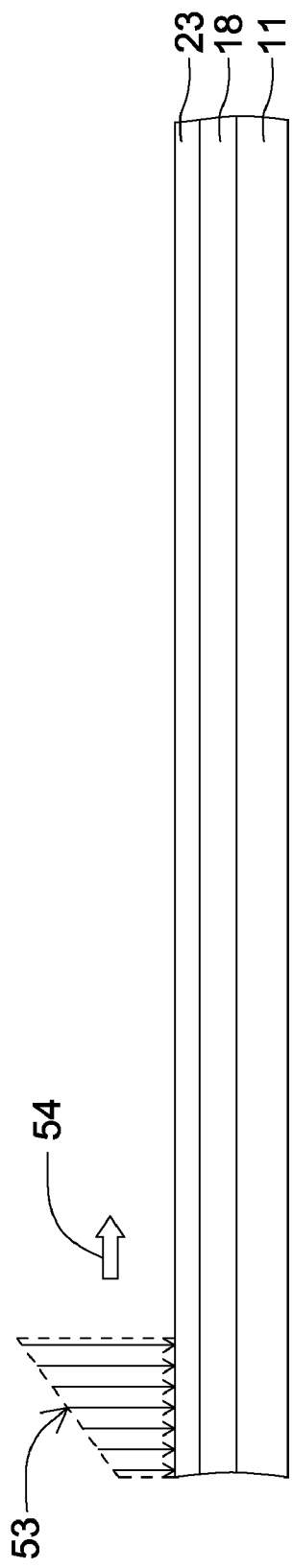
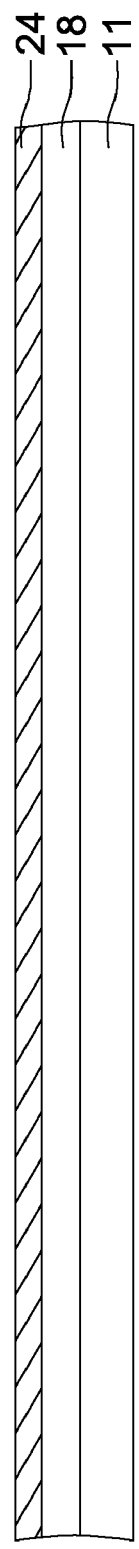
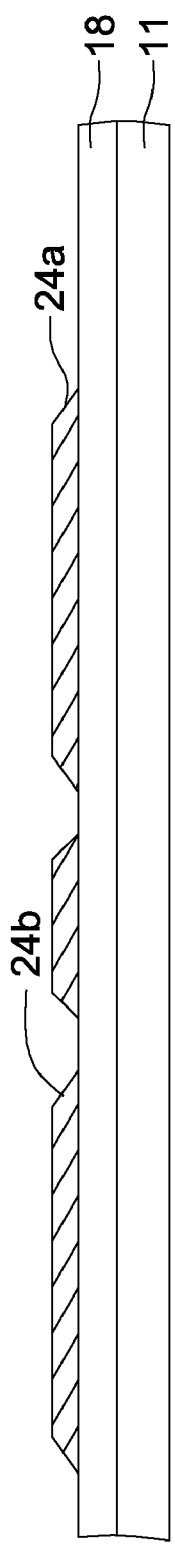
FIG. 7A
FIG. 7B
FIG. 7C

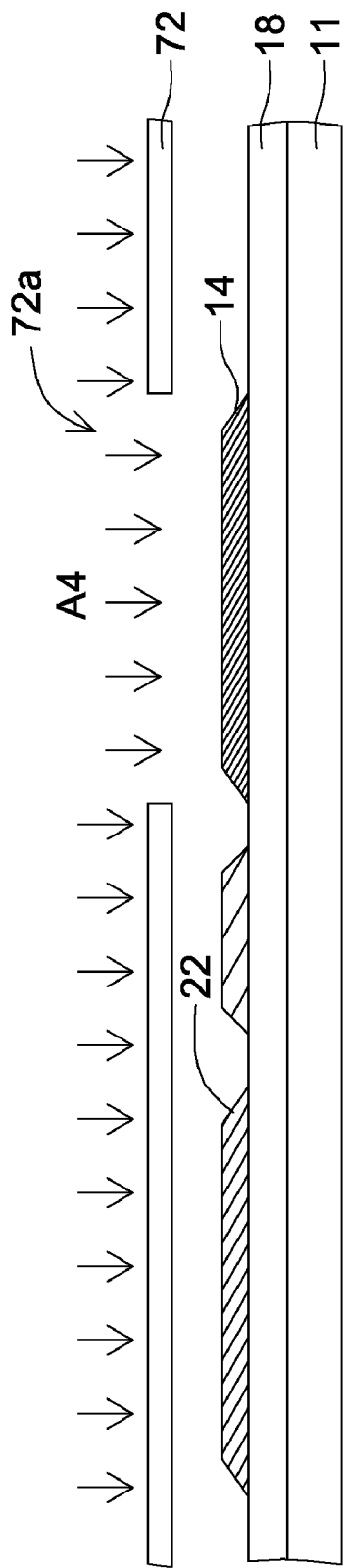
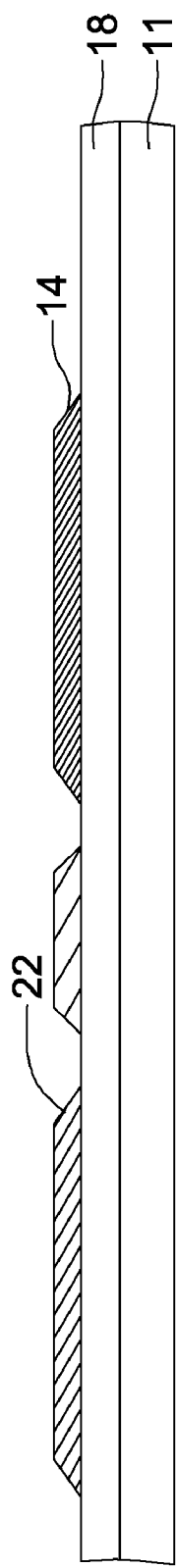
FIG. 7G
FIG. 7H

ORGANIC LIGHT EMITTING DIODE (OLED) DISPLAY PANEL AND METHOD OF FORMING POLYSILICON CHANNEL LAYER THEREOF

This application is a divisional application of U.S. patent application Ser. No. 11/395,338, filed on Apr. 3, 2006 which claims the benefit of priority based on Taiwan Application Number 94142373, filed Dec. 1, 2005, the subject matter of which are incorporated herein by reference.

BACKGROUND OF THE INVENTION

1. Field of the Invention

The invention relates in general to an organic light emitting diode (OLED) panel and a method of forming a polysilicon channel layer thereof, and more particularly to an OLED display panel having a dopant atom not selected from the IIIA group and the VA group doped inside a polysilicon channel layer and a method of forming the polysilicon channel layer thereof.

2. Description of the Related Art

In the conventional process of manufacturing a low temperature polysilicon (LTPS) liquid crystal display (LCD) panel and an organic light emitting diode (OLED) display panel, typically the excimer laser annealing (ELA) technology is used to scan and melt an amorphous silicon (a-Si) layer to form the crystallization of a polysilicon layer. The polysilicon layer can be used as a channel layer of a thin film transistor (TFT) to improve the electrical performance of the TFT.

According to related literatures, there are two types of defects affecting the electrical performance of polysilicon TFT, namely, the grain boundary trap defect and the interface trap defect. The grain boundary trap defect mainly occurs during the process of melting the crystallization of an amorphous silicon layer to form a polysilicon layer. When the ELA technology is used to melt the amorphous silicon layer to form the crystallization of a polysilicon layer (the technology is referred as the ELA crystallization technology hereafter), the number of grain boundary trap defects and the number of interface traps are approximately equal to 1012 and 1011, respectively. It can be seen from the number of defects that the channel quality of the polysilicon layer is greatly affected by the grain boundary trap defects.

In terms of an LTPS LCD, despite defects occur to the channel layer of the high efficient TFT manufactured according to the ELA crystallization technology, the TFT, which is merely used as a switch element of pixels, still meets the requirements of the LTPS LCD.

However, when it comes to OLED display panel, the above negative effect of defects can not be neglected. In the active pixel matrix of the OLED display panel, each pixel TFT drives an organic electroluminescent device (OELD) having an anode, a cathode and an organic material layer by a current. The polysilicon layer manufactured according to the ELA crystallization technology has non-uniformed crystallization and defects, causing the channel layer of each TFT to have different characteristics. As a result, line mura would occur to the OLED display panel, largely deteriorating the display quality of the OLED display panel.

SUMMARY OF THE INVENTION

It is therefore an object of the invention to provide an OLED display panel and a method of forming a polysilicon channel layer thereof. The design of disposing a dopant atom not selected from the IIIA group and the VA group inside the polysilicon layer (such as the polysilicon layer formed according to the ELA crystallization technology) formed by applying heat treatment to the crystallization of the amorphous silicon layer uniforms the defects of the polysilicon layer. Therefore, the non-uniform crystallization and defects of the polysilicon layer can be improved, so that the polysilicon channel layer of each TFT has the same characteristics. As a result, each pixel TFT has the same characteristics, preventing the OLED display panel from generating line mura during operation, largely improving the display quality of the OLED display panel.

The invention achieves the above-identified object by providing an OLED display panel including a substrate, a pixel and a thin film transistor. The pixel is disposed on the substrate. The thin film transistor disposed inside the pixel includes a polysilicon channel layer. A dopant atom not selected from the IIIA group and the VA group of periodic table the is doped inside the polysilicon channel layer.

The invention further achieves the above-identified object by providing a method of forming a polysilicon channel layer. At first, a substrate having an amorphous silicon layer disposed thereon is provided. Then, heat treatment is applied to the amorphous silicon layer to form a polysilicon layer. Then, a dopant atom not selected from the IIIA group and the VA group of periodic table is doped inside the polysilicon layer to form a polysilicon channel layer.

The invention further achieves the above-identified object by providing a method of forming a polysilicon channel layer. At first, a substrate having a first polysilicon layer and a second polysilicon layer disposed thereon is provided. Then, a mask having an opening for exposing the first polysilicon layer is used to cover the substrate. Then, a dopant atom not selected from the IIIA group and the VA group of periodic table is doped inside the first polysilicon layer to form a polysilicon channel layer.

The invention further achieves the above-identified object by providing a method of forming a polysilicon channel layer. At first, a substrate having a first polysilicon layer and a second polysilicon layer disposed thereon is provided. Then, a first mask having a first opening and a second opening for respectively exposing the first polysilicon layer and the second polysilicon layer is used to cover the substrate. Then, a first dopant atom not selected from the IIIA group and the VA group of periodic table is doped inside the first polysilicon layer and the second polysilicon layer to respectively form a first polysilicon channel layer and a second polysilicon channel layer. The doping concentration of the first dopant atom in the first polysilicon channel layer is the same with the doping concentration of the first dopant atom in the second polysilicon channel layer. Then, the first mask is removed, and a second mask having a third opening for exposing the first polysilicon channel layer is used to cover the substrate. Then, a second dopant atom not selected from the IIIA group and the VA group of periodic table is doped inside the first polysilicon channel layer to form a third polysilicon channel layer. The total doping concentration of the first dopant atom and the second dopant atom in the third polysilicon channel layer is larger than the doping concentration of the first dopant atom in the second polysilicon channel layer.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 5A~5H illustrate cross-sectional views of the manufacturing process of a polysilicon channel layer according to the third embodiment of the invention;

FIGS. 7A~7H illustrate cross-sectional views of the manufacturing process of a polysilicon channel layer according to the fourth embodiment of the invention.

DETAILED DESCRIPTION OF THE INVENTION

First Embodiment

Figure 1:
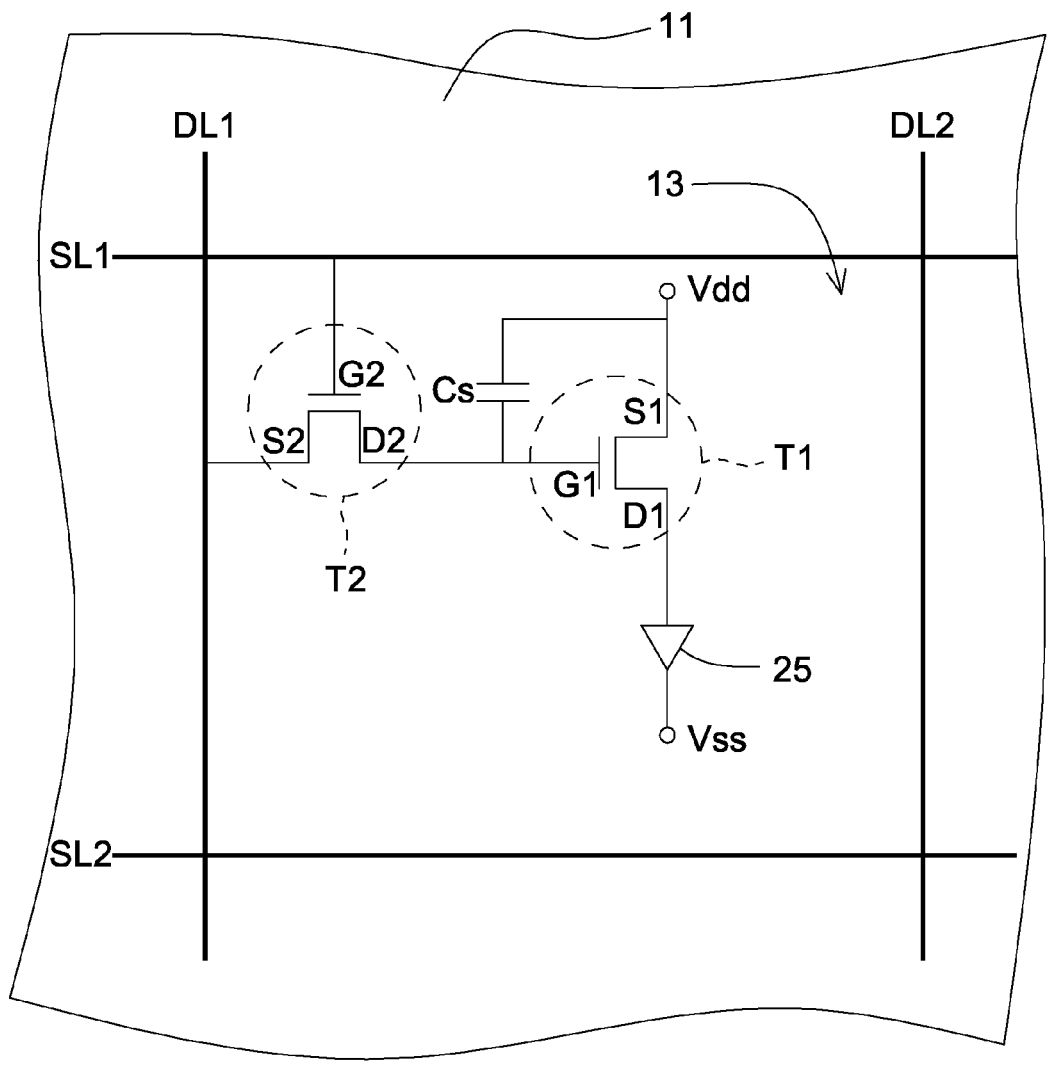
FIG. 1 illustrates a circuit structure of a single pixel of an organic light emitting diode (OLED) display panel according to a first embodiment of the invention.
Figure 2:
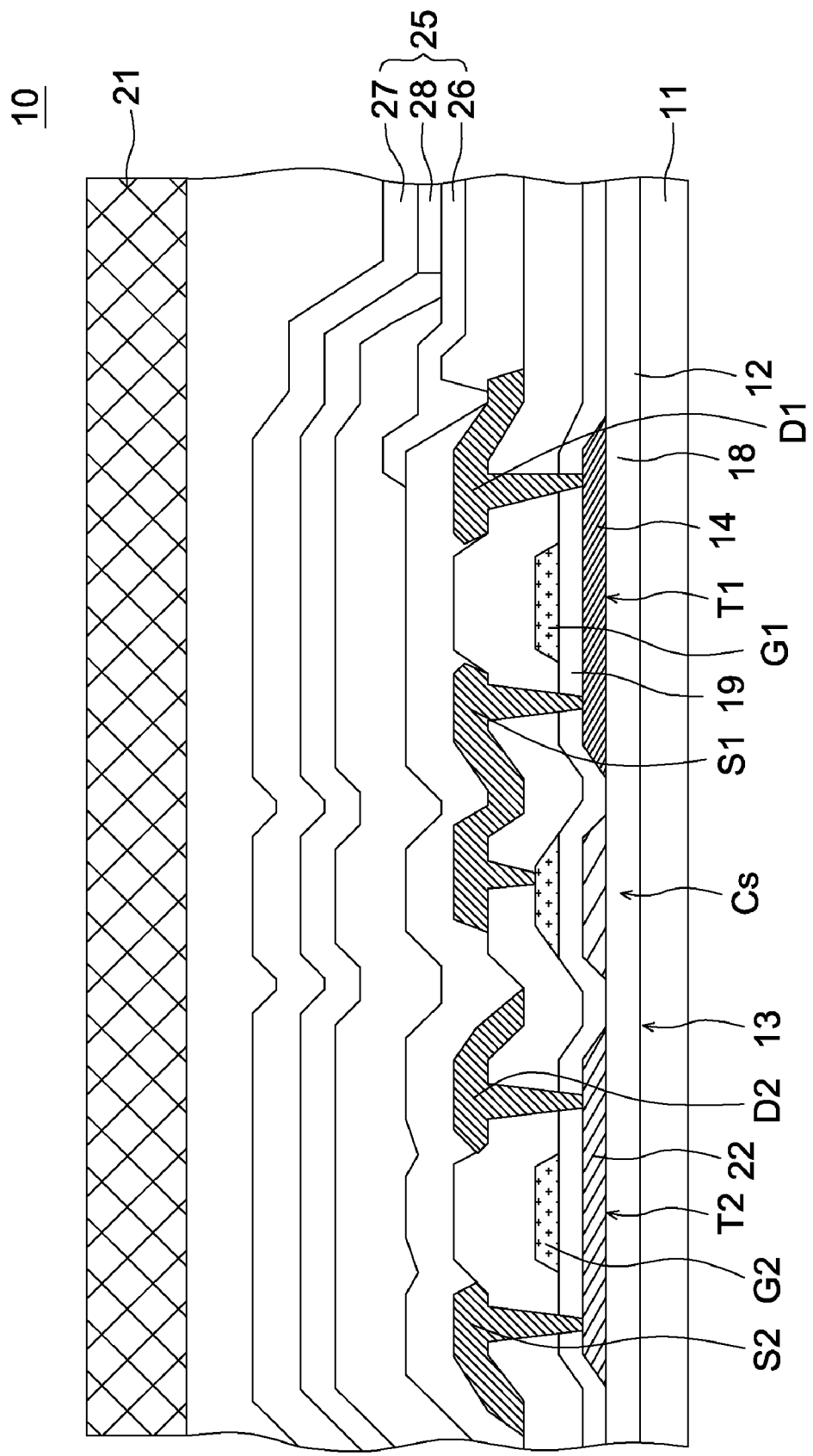
FIG. 2 illustrates a cross-sectional view of detailed structure of the single pixel of the OLED display panel according to the first embodiment of the invention.

Referring to FIGS. 1~2. FIG. 1 illustrates a circuit structure of a single pixel of an organic light emitting diode (OLED) display panel according to a first embodiment of the invention. FIG. 2 illustrates a cross-sectional view of detailed structure of the single pixel of the OLED display panel according to the first embodiment of the invention. As shown in FIGS. 1~2, the OLED display panel 10 at least includes a substrate 11, a pixel 13 and a first thin film transistor (TFT) T1. The pixel 13 disposed on the substrate 11 is exemplified by one of the several pixels of an active matrix pixel array. The first thin film transistor T1 disposed inside the pixel 13 includes a first polysilicon channel layer 14. Apart from a polysilicon, the first polysilicon channel layer 14 further includes a first dopant atom not selected from the III A group and the VA group of periodic table to uniform the defects of the polysilicon layer before doping. Therefore, the non-uniformity of the defects and crystallization of the polysilicon layer can be improved, and the polysilicon channel layer of each pixel TFT can have the same characteristics. As a result, the OLED display panel will not generate line mura during operation, largely improving the display quality of the OLED display panel and greatly impressing the consumers.

Examples of the first dopant atom doped inside the first polysilicon channel layer 14 includes a neutral atom, an inert gas and/or the IV A group of periodic table. For example, the first dopant atom is a dopant atom selected from the group consisting of helium (He), neon (Ne), argon (Ar), krypton (Kr), xenon (Xe) and radon (Rn) and any combination thereof. The first dopant atom is a dopant atom selected from the group consisting of carbon (C), silicon (Si), germanium (Ge), tin (Sn) and lead (Pb) and any combination thereof. The first dopant atom can also be selected from the combination of inert gases and the IV A group. However, the technology of the present embodiment of the invention is not limited thereto. For example, the first dopant atom can be selected from neutral dopant atoms other than the IIIA group and the VA group of the periodic table. That is, the first dopant atom is not selected from the IIIA group and the VA group of the periodic table. Furthermore, the doping dose of the first dopant atom in the first polysilicon channel layer 14 ranging $10^{11} \sim 10^{15}$ atoms/cm$^2$ can be larger than $10^{12}$ atoms/cm$^2$. The above first polysilicon channel layer 14 can be achieved by doping a polysilicon layer with the first dopant atom, and the polysilicon layer can be achieved by applying heat treatment to an amorphous silicon layer. For example, the amorphous silicon layer can be melted according to the laser annealing method to form the crystallization of the polysilicon layer. In the laser annealing method, the amorphous silicon layer is scanned and melted by an excimer laser.

In the process of manufacturing the first thin film transistor T1 according to the present embodiment of the invention, at first, the amorphous silicon layer is melted according to the excimer laser annealing (ELA) crystallization technology to form the crystallization of the polysilicon layer. Then, a fixed amount of first dopant atom is doped inside the polysilicon layer to achieve the above first polysilicon channel layer 14.

In the present embodiment of the invention, the first thin film transistor T1 further includes a first gate G1, a first source S1 and a first drain D1. The first source S1 and the first drain D1 are disposed on the first polysilicon channel layer 14, and are correspondingly and electrically connected to the two ends of the first polysilicon channel layer 14. The first gate G1 is disposed on the first polysilicon channel layer 14, and positioned between the first source S1 and the first drain D1. The first source S1 and the first drain D1 respectively are electrically connected to and contact the polysilicon channel layer 14 via a heavily doping N type layer (N+).

Moreover, the OLED display panel 10 further includes a first scan line SL1, a second scan line SL2, a first data line DL1, a second data line DL2, and a second thin film transistor T2. The first scan line SL1 and the second scan line SL2 are disposed on the substrate 11 in parallel. The first data line DL1 and the second data line DL2 are disposed on the substrate 11 in parallel, and are respectively perpendicular to and alternate with the first scan line SL1 and the second scan line SL2 to define the pixel 13. The second thin film transistor T2 disposed inside the pixel 13 includes a second gate G2, a second source S2, a second drain D2 and a second polysilicon channel layer 22. The second source S2 and the second drain D2 are correspondingly disposed on the two ends of the second polysilicon channel layer 22, and are electrically connected to and ohmly contact the two ends of the second polysilicon channel layer 22 via the N+ layer, respectively. The second gate G2 is electrically connected to the first scan line SL1. The second source S2 is electrically connected to the first data line DL1. The second drain D2 is electrically connected to the first gate G1.

A second dopant atom not selected from the IIIA group and the VA group is doped inside the second polysilicon channel layer 22. The doping concentration of the second dopant atom in the second polysilicon channel layer 22 is the same or different with the doping concentration of the first dopant atom in the first polysilicon channel layer 14. The doping concentration of the first dopant atom in the first polysilicon channel layer 14 can be larger than the doping concentration of the second dopant atom in the second polysilicon channel layer 22. Examples of the second dopant atom include a neutral atom, an inert gas and/or the IV A group. For example, the second dopant atom is a dopant atom selected from the group consisting of helium (He), neon (Ne), argon (Ar), krypton (Kr), xenon (Xe) and radon (Rn) and any combination thereof. The second dopant atom is a dopant atom selected from the group consisting of carbon (C), silicon (Si), germanium (Ge), tin (Sn) and lead (Pb) and any combination thereof. The second dopant atom can be selected from the combination of inert gases and the IV A group. The first dopant atom is the same or different with the second dopant atom. The second dopant atom can be selected from the neutral dopant atoms other than the IIIA group and the VA group of the periodic table. Moreover, the above second polysilicon channel layer 22 can be achieved by doping a polysilicon layer with the second dopant atom, and the polysilicon layer can be achieved by applying heat treatment to an amorphous silicon layer. For example, the amorphous silicon layer can be melted according to the laser annealing method to form the crystallization of the polysilicon layer. In the laser annealing method, the amorphous silicon layer is scanned and melted by an excimer laser.

The OLED display panel 10 further includes a storage capacitor Cs and an organic electroluminescent device (OELD) 25. The storage capacitor Cs is disposed inside the pixel 13. One end of the storage capacitor Cs is electrically connected between the first gate G1 and the second drain D2, and the other end of the storage capacitor Cs is electrically connected between the first source S1 and a first constant voltage Vdd. The OELD 25 is disposed inside the pixel 13 to be electrically connected to the first drain D1 and a second constant voltage Vss.

Any one who is skilled in the technology of the present embodiment of the invention will understand that the technology of the present embodiment of the invention is not limited thereto. For example, the OLED display panel 10 further includes an isolation layer 18 disposed among the first polysilicon channel layer 14, the second polysilicon channel layer 22 and the substrate 11. Besides, the OLED display panel 10 further includes an isolation layer 19 disposed among the first gate G1, the second gate G2 and the first polysilicon channel layer 14. Examples of the isolation layers 18 and 19 include oxide, nitride, nitroxide, nitro-silicon or nitrogen oxide.

The detailed structure of the OELD 25 is exemplified below. However, the technology of the present embodiment of the invention is not limited thereto. The OELD 25 at least includes an anode 26, a cathode 27 and an organic material layer 28. The organic material layer 28 is disposed between the anode 26 and the cathode 27. The anode 26 is electrically connected to the first drain D1. The cathode 27 can be grounded or receive a constant voltage. The organic material layer 28 can include an electron hole source, an electron source and a light emitting layer. The light emitting layer is disposed between the electron hole source and the electron source. The electron hole source is adjacent to the anode 26, and the electron source is adjacent to the cathode 27.

In the present embodiment of the invention, the OLED display panel 10 further includes a substrate 21. The substrate 21 and the substrate 11 are assembled in parallel by a sealant for sealing and enclosing the pixel 13, the first thin film transistor T1, the second thin film transistor T2, the storage capacitor Cs and the OELD 25. Examples of the substrates 11 and 21 include glass substrate, plastic substrate, ceramic substrate or flexible substrate.

Despite the present embodiment of the invention is exemplified by the TFT structure of the top gate, the technology of doping the polysilicon channel layer of the present embodiment of the invention with a dopant atom not selected from the IIIA group and the VA group can be applied to the TFT structure of the bottom gate or the dual gates.

According to the present embodiment of the invention, after the amorphous silicon layer is melted according to the excimer laser annealing (ELA) method to form the crystallization of the polysilicon layer (the ELA crystallization technology), the original density of the defects of the polysilicon layer is adjusted by doping the dopant atom not selected from the IIIA group and the VA group inside the polysilicon layer to form the polysilicon channel layer. As the doping amount and density of the dopant atom not selected from the IIIA group and the VA group can be precisely controlled, the characteristics of the TFT can be effectively controlled accordingly. The uniformity achieved according to the doping technology improves the non-uniformity of the ELA crystallization method as well as the line mura effect. The table disclosed below illustrates the improvement in the density of defects of the channel layer of the OLED display panel. The resulted line mura of the entire OLED display panel before the dopant atom not selected from the IIIA group and the VA group is doped is compared with the resulted line mura of the entire OLED display panel after the dopant atom not selected from the IIIA group and the VA group is doped. However, the technology of the present embodiment of the invention is not limited thereto.

TABLE 1

|  | Area Without Line Mura | Area With Line Mura | Defect Ratio |
| --- | --- | --- | --- |
| Defect Concentration Before Doping (defects/cm$^2$) | $10^{12}$ | $10^{13}$ | 10 |
| The Doping concentration of the Dopant Atom not Selected from the III A Group and the VA Group (atoms/cm$^2$) | $10^{13}$ | $10^{13}$ | 1 |
| Defect Concentration After Doping (defects/cm$^2$) | $1.1 * 10^{13}$ | $2 * 10^{13}$ | 1.67 |

It can be seen from Table 1 that in a conventional OLED display panel without doping the dopant atom not selected from the IIIA group and the VA group, the defect ratio between the defects of the area with line mura and the defects of the area without line mura is 10:1. In the OLED display panel of the present embodiment of the invention, after doping the dopant atom not selected from the IIIA group and the VA group in the polysilicon layer, the doping concentration of the dopant atom not selected from the IIIA group and the VA group increases by 10 times. The defect ratio between defects of the area with line mura and the defects of the area without line mura is improved from 10:1 to 1.67:1 after doping a calculated amount of dopant not selected from the IIIA group and the VA group. By doping an appropriate amount of the dopant atom not selected from the IIIA group and the VA group, the channel quality is uniformed so that the polysilicon channel layer of each pixel TFT has the same characteristics and that the non-uniformity of defects and ELA crystallization of is improved. As a result, each pixel TFT has the same characteristics.

With regard to the performance of the OLED display panel under different doping densities of the dopant atom not selected from the IIIA group and the VA group according to the present embodiment of the invention, the doping dose of the dopant atom not selected from the IIIA group and the VA group is $1.5*10^{12}/cm^2$ and still has line mura. However, the line mura in the present embodiment of the invention is fewer than the line mura under standard conditions.

When the doping dose of the dopant atom not selected from the III A group and the VA group is $1.5*10^{13}/cm^2$, no line mura occurs. The effect of line mura can be improved by appropriately adjusting the doping concentration of the dopant atom not selected from the IIIA group and the VA group. This is because the performance of the channel quality is dominated by the effect of doping the dopant atom not selected from the IIIA group and the VA group instead of the ELA crystallization technology.

The grain size of the polysilicon layer before doping ranges 0.1~10 μm. The density of the grain boundary defect of the polysilicon layer is larger than $10^{11}$ defects/cm$^2$. When the polysilicon layer is within 5 μm, the largest thickness differs with the smallest thickness by more than 100 Å, that is, the height of the protrusion of the polysilicon layer, and the doping dose of the first dopant atom not selected from the IIIA group and the VA group doped inside the first polysilicon channel layer 14 can be larger than $10^{12}$ atoms/cm$^2$. Therefore, the present embodiment of the invention, according to the grain size of the polysilicon layer, the density of grain boundary defect, and the height of the protrusion of the polysilicon layer, can appropriately adjust the density of the dopant atom not selected from the IIIA group and the VA group doped inside the polysilicon layer to form the needed polysilicon channel layer.

Second Embodiment

Figure 3:
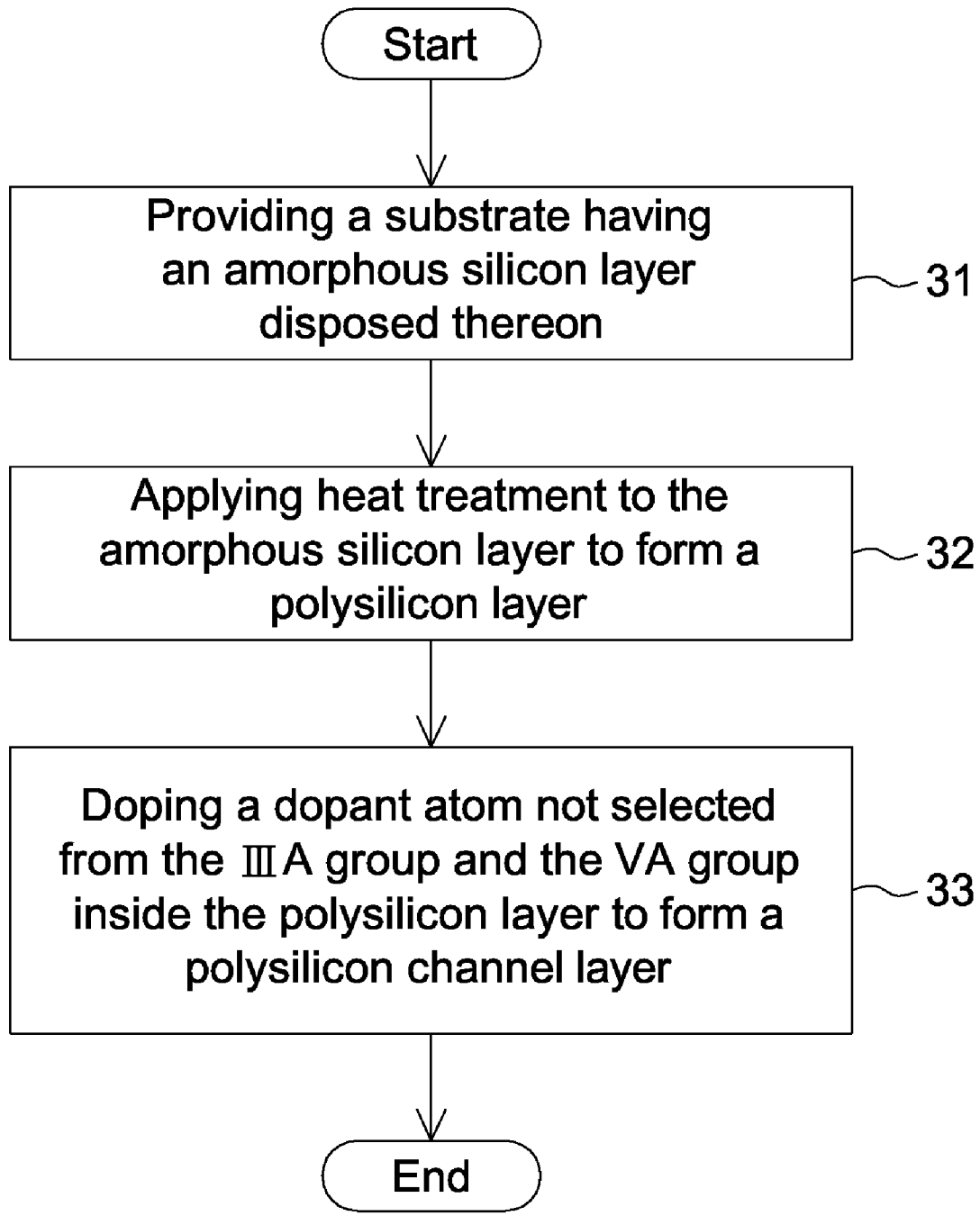
FIG. 3 is a flowchart of a method of forming a polysilicon channel layer according to a second embodiment of the invention.

Referring to FIG. 3, a flowchart of a method of forming a polysilicon channel layer according to a second embodiment of the invention is shown. As shown in FIG. 3, at first, in the step 31, a substrate having an amorphous silicon layer disposed thereon is provided. Then, proceed to the step 32, heat treatment is applied to the amorphous silicon layer to form a polysilicon layer. Then, proceed to the step 33, a dopant atom not selected from the III A group and the VA group is doped inside the polysilicon layer to form a polysilicon channel layer. Examples of the dopant atom include a neutral atom, an inert gas and/or the IV A group. For example, a dopant atom is selected from the group consisting of helium (He), neon (Ne), argon (Ar), krypton (Kr), xenon (Xe) and radon (Rn) and any combination thereof, but is not selected from the IIIA group and the VA group in the periodic table. The dopant atom is a dopant atom selected from the group consisting of carbon (C), silicon (Si), germanium (Ge), tin (Sn) and lead (Pb) and any combination thereof. The dopant atom can be selected from the combination of inert gases and the IV A group. Besides, the doping dose of the dopant atom in the polysilicon channel layer ranging $10^{11}$~$10^{15}$ atoms/cm$^2$ can be larger than $10^{12}$ atoms/cm2. Besides, heat treatment can also be applied to the amorphous silicon layer according to the laser annealing method. For example, the amorphous silicon layer is step scanned and melted by an excimer laser to form the polysilicon layer according to the ELA crystallization technology.

In the present embodiment of the invention, the design of doping the crystallization of the polysilicon layer formed by applying heat treatment to the amorphous silicon layer (such as the polysilicon layer formed according to the ELA crystallization technology) with the dopant atom not selected from the IIIA group and the VA group (such as inert gases) enables the defects of the polysilicon layer to be uniformed, improving the non-uniformity of the defects and crystallization of the polysilicon. Thus, the OLED display panel manufactured in subsequent manufacturing process will not generate line mura during operation, largely improving the display quality of the OLED display panel.

Third Embodiment

Figure 4:
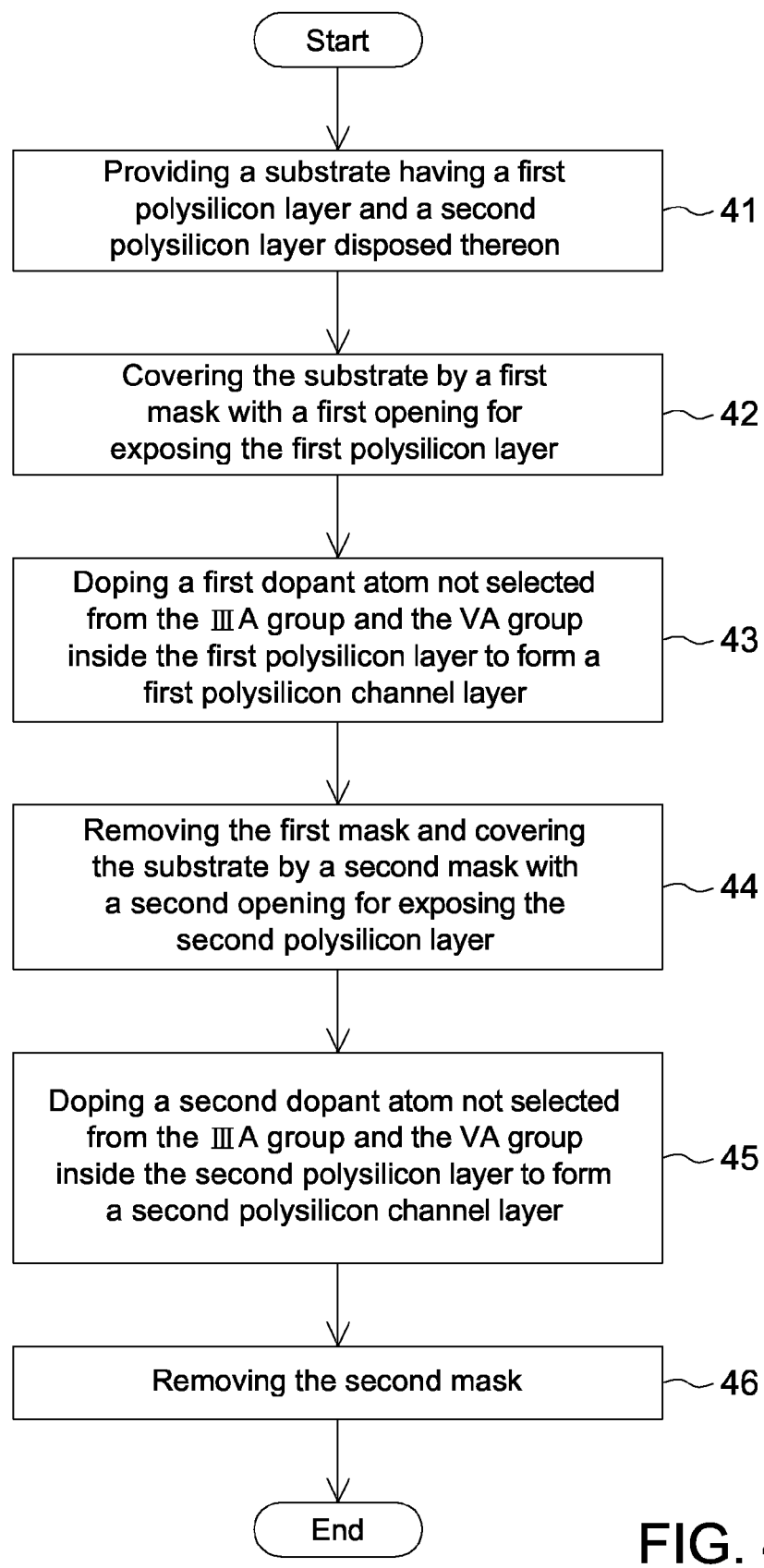
FIG. 4 is a flowchart of a method of forming a polysilicon channel layer according to a third embodiment of the invention.
Figure 5A:
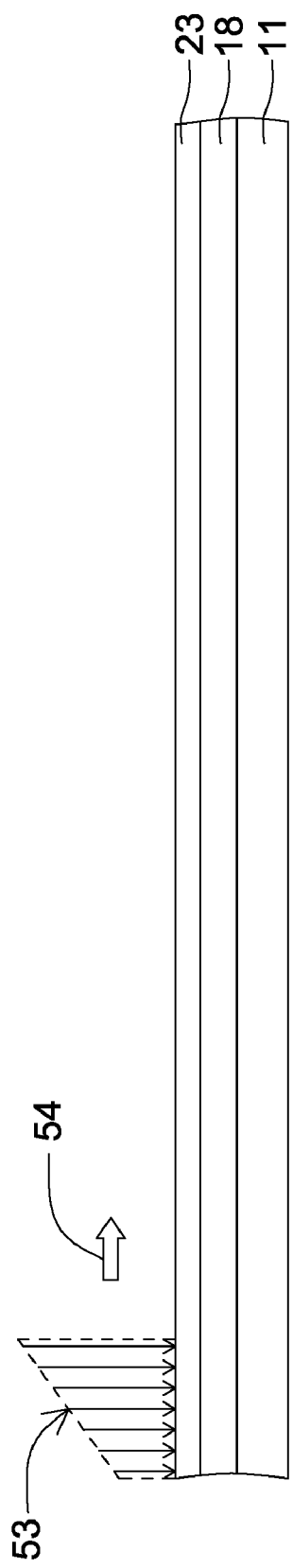
Figure 5B:
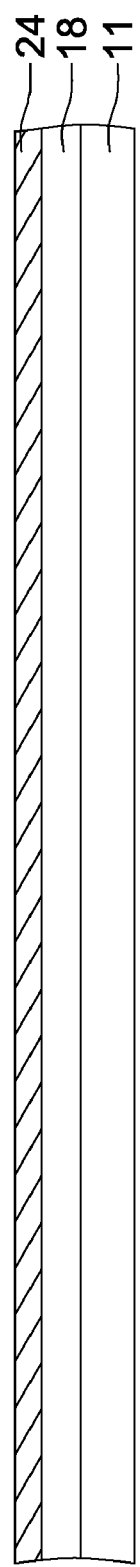
Figure 5C:
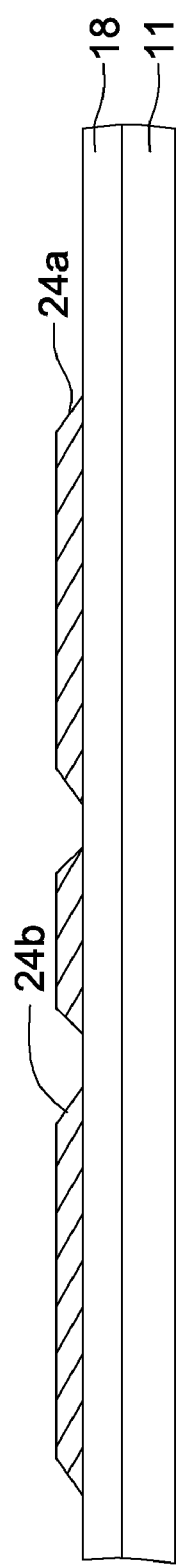

Referring to FIGS. 4~5H. FIG. 4 is a flowchart of a method of forming a polysilicon channel layer according to a third embodiment of the invention. FIGS. 5A~5H illustrate cross-sectional views of the manufacturing process of a polysilicon channel layer according to the third embodiment of the invention. As shown in FIG. 4, at first, in the step 41, a substrate 11 having a first polysilicon layer 24a and a second polysilicon layer 24b disposed thereon is provided. As for how the first polysilicon layer 24a and the second polysilicon layer 24b are formed on the substrate 11 is exemplified below. However, the technology of the present embodiment of the invention is not limited thereto. As shown in FIG. 5A, the substrate 11 having an amorphous silicon layer 23 disposed thereon is provided. Then, heat treatment is applied to the amorphous silicon layer 23 to form a polysilicon layer 24 as shown in FIG. 5B. Here, heat treatment can be applied to the amorphous silicon layer 23 according to the laser annealing method. For example, the amorphous silicon layer 23 is step scanned and melted by an excimer laser 53 along the direction of the arrow 54 in FIG. 5A to form the crystallization of the polysilicon layer 24 step by step. Then, as shown in FIG. 5C, part of the polysilicon layer 24 is removed form the first polysilicon layer 24a and the second polysilicon layer 24b. However, the technology of forming the first polysilicon layer 24a and the second polysilicon layer 24b according to the present embodiment of the invention is not limited thereto.

Figure 5D:
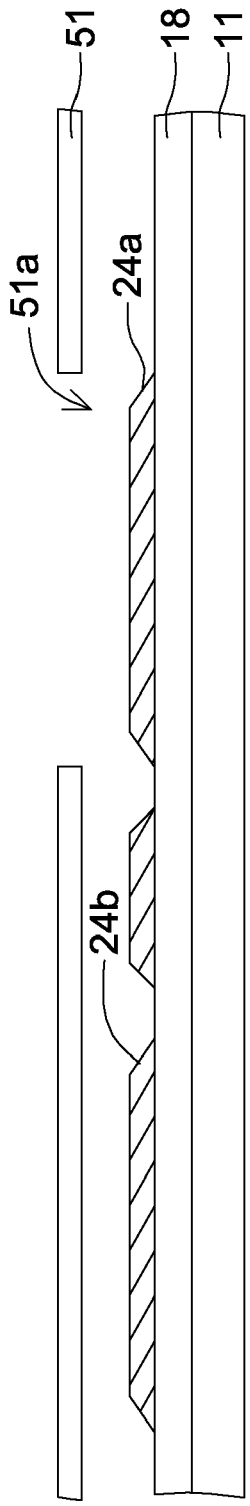

After the first polysilicon layer 24a and the second polysilicon layer 24b are formed on the substrate 11, proceed to the step 42 as shown in FIG. 5D, the substrate 11 is covered by a first mask 51. The first mask 51 has a first opening 51a used for exposing the first polysilicon layer 24a.

Figure 5E:
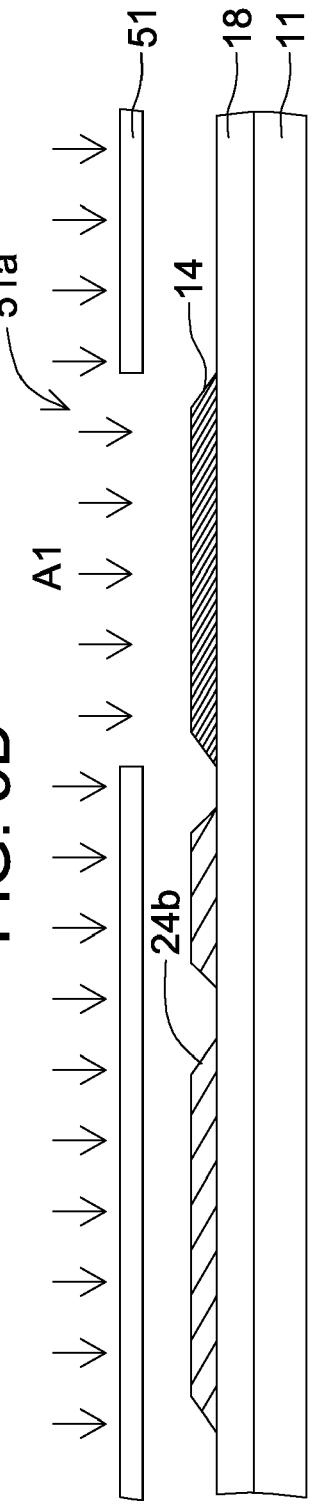

Then, proceed to the step 43 as shown in FIG. 5E, a first dopant atom not selected from the IIIA group and the VA group A1 is doped inside the first polysilicon layer 24a to form a first polysilicon channel layer 14. Examples of the first dopant atom A1 include a neutral atom, an inert gas and/or the IV A group. The first dopant atom A1 is selected from the group consisting of helium (He), neon (Ne), argon (Ar), krypton (Kr), xenon (Xe) and radon (Rn) and any combination thereof. The first dopant atom A1 is a dopant atom selected from the group consisting of carbon (C), silicon (Si), germanium (Ge), tin (Sn) and lead (Pb) and any combination thereof. The first dopant atom A1 can be selected from the combination of inert gases and the IV A group. The doping dose of the first dopant atom A1 in the first polysilicon channel layer 14 ranges $10^{11}$~$10^{15}$ atoms/cm$^2$. In the step 43, the first dopant atom A1 can be used as a source of dopant to be doped inside the first polysilicon layer 24a according to the ion implantation method.

Figure 5F:
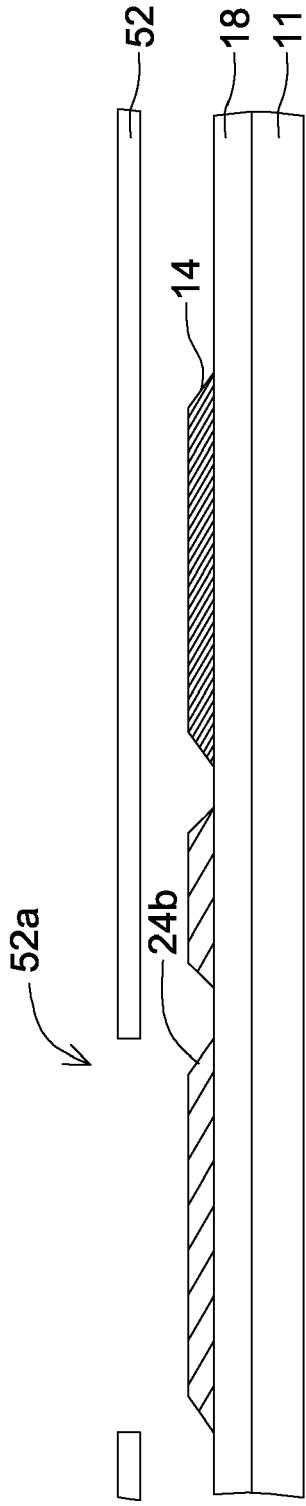

Then, proceed to the step 44 as shown in FIG. 5F, the first mask 51 is removed, and the substrate 11 is covered by a second mask 52. The second mask 52 has a second opening 52a used for exposing the second polysilicon layer 24b.

Then, proceed to the step 45 as shown in FIG. 5G, a second dopant atom not selected from the IIIA group and the VA group A2 is doped inside the second polysilicon layer 24b to form a second polysilicon channel layer 22. Examples of the second dopant atom A2 include a neutral atom, an inert gas and/or the IV A group. The doping concentration of the second dopant atom A2 in the second polysilicon channel layer 22 is the same or different with the doping concentration of the first dopant atom A1 in the first polysilicon channel layer 14. The doping concentration of the first dopant atom A1 in the first polysilicon channel layer 14 is larger than the doping concentration of the second dopant atom A2 in the second polysilicon channel layer 22. The second dopant atom is a dopant atom selected from the group consisting of helium (He), neon (Ne), argon (Ar), krypton (Kr), xenon (Xe) and radon (Rn) and any combination thereof. The second dopant atom A2 is a dopant atom selected from the group consisting of carbon (C), silicon (Si), germanium (Ge), tin (Sn) and lead (Pb) and any combination thereof. The second dopant atom A2 can be selected from the combination of inert gases and the IV A group. The first dopant atom A1 and the second dopant atom A2 can be the same or different. In the step 45, the second dopant atom A2 can be used as a source of dopant to be doped inside the second polysilicon layer 24b according to the ion implantation method. Then, proceed to the step 46 as shown in FIG. 5H, the second mask 52 is removed.

Any one who is skilled in the technology of the present embodiment of the invention will understand that the technology of the present embodiment of the invention is not limited thereto. For example, after the first polysilicon layer 24a and the second polysilicon layer 24b are formed on the substrate 11, a thin sacrifice layer such as silicon dioxide ($SiO_2$) can be used to cover the first polysilicon layer 24a and the second polysilicon layer 24b. Besides. after the second dopant atom A2 is doped inside the second polysilicon layer 24b, dilute HF is used to remove the sacrifice layer. Here, the sacrifice layer can be used as a buffer layer when the first dopant atom A1 and the second dopant atom A2 are respectively doped inside the first polysilicon layer 24a and the second polysilicon layer 24b to mitigate the damage occurring to the surface of the first polysilicon layer 24a and the source of the second polysilicon layer 24b when doped with the first dopant atom A1 and the second dopant atom A2, respectively.

Fourth Embodiment

Figure 6:
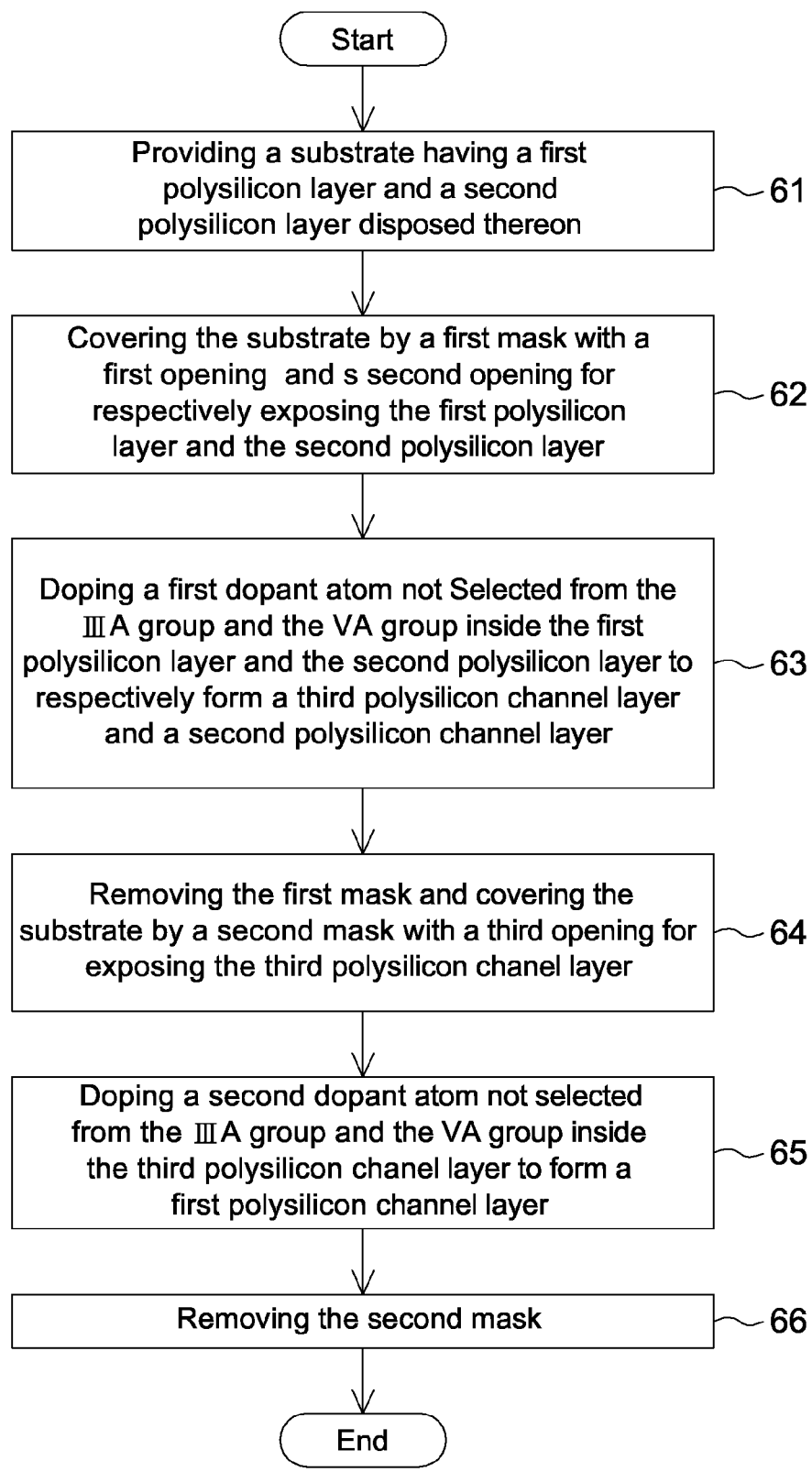
FIG. 6 is a flowchart of a method of forming a polysilicon channel layer according to a fourth embodiment of the invention.
Figure 7D:
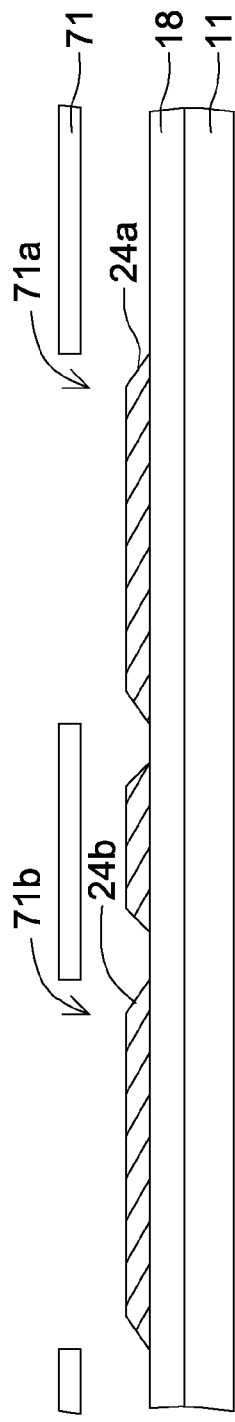
Figure 7E:
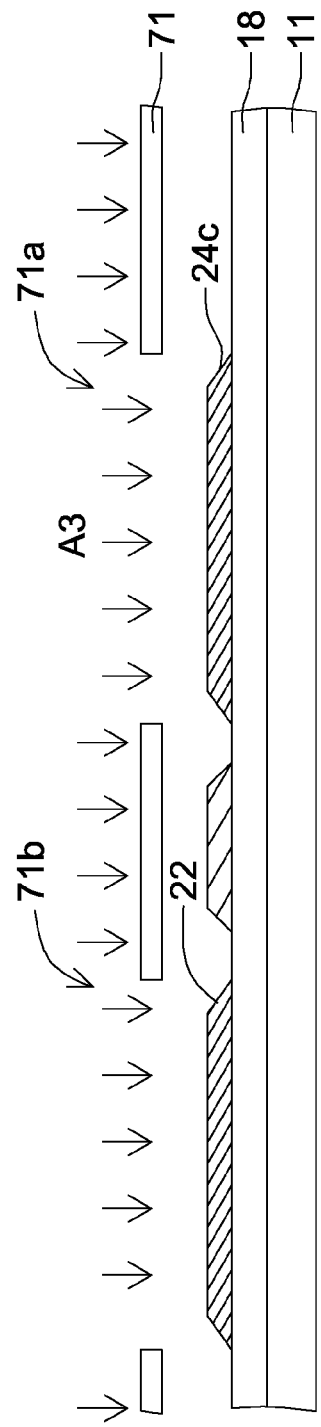
Figure 7F:
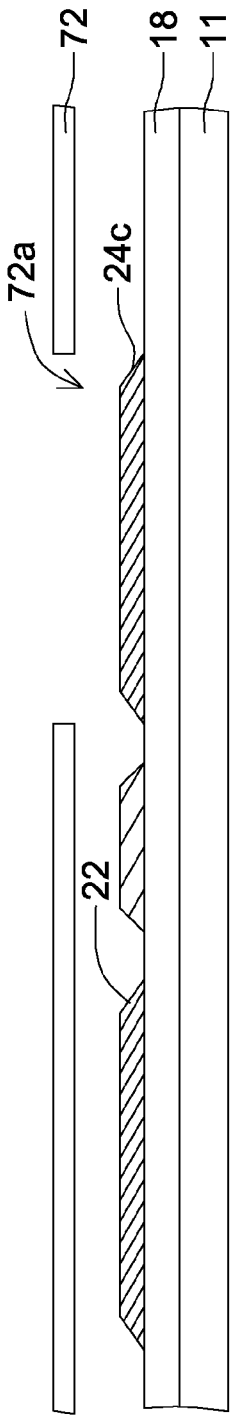

Referring to FIGS. 6~7H. FIG. 6 is a flowchart of a method of forming a polysilicon channel layer according to a fourth embodiment of the invention. FIGS. 7A~7H illustrate cross-sectional views of the manufacturing process of a polysilicon channel layer according to the fourth embodiment of the invention. As shown in FIG. 6, at first, in the step 61, a substrate 11 having a first polysilicon layer 24a and a second polysilicon layer 24b disposed thereon is provided. As for how the first polysilicon layer 24a and the second polysilicon layer 24b are formed on the substrate 11 as shown in FIGS. 7A~7C is already disclosed in the second embodiment, and is not repeated here.

Then, proceed to the step 62 as shown in FIG. 7D, the substrate 11 is covered by a first mask 71. The first mask 71 has a first opening 71a and a second opening 71b. The first opening 71a and the second opening 71b are respectively used for exposing the first polysilicon layer 24a and the second polysilicon layer 24b.

Then, proceed to the step 63 as shown in FIG. 7E, a first dopant atom not selected from the IIIA group and the VA group A3 is doped inside the first polysilicon layer 24a and the second polysilicon layer 24b to respectively form a third polysilicon channel layer 24c and a second polysilicon channel layer 22. Examples of the first dopant atom A3 include a neutral atom, an inert gas and/or the IV A group. The doping concentration of the first dopant atom A3 in the second polysilicon channel layer 22 is the same with the doping concentration of the first dopant atom A3 in the third polysilicon channel layer 24c. The first dopant atom A3 is a dopant atom selected from the group consisting of helium (He), neon (Ne), argon (Ar), krypton (Kr), xenon (Xe) and radon (Rn) and any combination thereof. The first dopant atom A3 is a dopant atom selected from the group consisting of carbon (C), silicon (Si), germanium (Ge), tin (Sn) and lead (Pb) and any combination thereof. The first dopant atom A3 can be selected from the combination of inert gases and the IV A group. In the step 63, the first dopant atom A3 is used as a source of dapant to be doped inside the first polysilicon layer 24a and the second polysilicon layer 24b according to the ion implantation method.

Then, proceed to the step 64 as shown in FIG. 7F, the first mask 71 is removed, and the substrate 11 is covered by a second mask 72. The second mask 72 has a third opening 72a used for exposing the third polysilicon channel layer 24c.

Then, proceed to the step 65 as shown in FIG. 7G, a second dopant atom not selected from the IIIA group and the VA group A4 is doped inside the third polysilicon channel layer 24c to form a first polysilicon channel layer 14. Examples of the second dopant atom A4 include a neutral atom, an inert gas and/or the IV A group. The total doping concentration of the first dopant atom A3 and the second dopant atom A4 in the first polysilicon channel layer 14 is the same or different with the doping concentration of the first dopant atom A3 in the second polysilicon channel layer 22. For example, the total doping concentration of the first dopant atom A3 and the second dopant atom A4 in the first polysilicon channel layer 14 is larger than the doping concentration of the first dopant atom A3 in the second polysilicon channel layer 22. The total doping dose of the first dopant atom A3 and the second dopant atom A4 in the first polysilicon channel layer 14 ranges $10^{11}$~$10^{15}$ atoms/cm$^2$, or is larger than $10^{12}$ atoms/cm$^2$. The second dopant atom A4 is a dopant atom selected from the group consisting of helium (He), neon (Ne), argon (Ar), krypton (Kr), xenon (Xe) and radon (Rn) and any combination thereof. The second dopant atom A4 is a dopant atom selected from the group consisting of carbon (C), silicon (Si), germanium (Ge), tin (Sn) and lead (Pb) and any combination thereof. The second dopant atom A4 can also be selected from the combination of inert gases and the IV A group. The first dopant atom A3 and the second dopant atom A4 can be the same or different. In the step 65, the second dopant atom A4 can be used as a source of the dapant to be doped inside the third polysilicon channel layer 24c according to the ion implantation method. Then, proceed to the step 66 as shown in FIG. 7H, the second mask 72 is removed.

An OLED display panel and a method of forming a polysilicon channel layer thereof are disclosed in the above embodiments of the invention. The design of disposing a dopant atom not selected from the IIIA group and the VA group inside the polysilicon layer (such as the polysilicon layer formed according to the ELA crystallization technology) formed by applying heat treatment to the crystallization of the amorphous silicon layer can uniform the defects of the polysilicon layer. Therefore, the non-uniform crystallization and defect of the polysilicon layer can be improved, so that the polysilicon channel layer of each pixel TFT has the same characteristics. As a result, each pixel TFT has the same characteristics, preventing the OLED display panel from generating line mura during operation, largely improving the display quality of the OLED display panel.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a polysilicon channel layer, comprising:
   providing a substrate having a first polysilicon layer and a second polysilicon layer disposed thereon;

covering the substrate by a first mask, wherein the first mask has a first opening and a second opening for respectively exposing the first polysilicon layer and the second polysilicon layer;

doping a first dopant atom not selected from the IIIA group and the VA group inside the first polysilicon layer and the second polysilicon layer to respectively form a first polysilicon channel layer and a second polysilicon channel layer, wherein the doping concentration of the first dopant atom in the first polysilicon channel layer is the same with the doping concentration of the first dopant atom in the second polysilicon channel layer;

removing the first mask and covering the substrate by a second mask, wherein the second mask has a third opening for exposing the first polysilicon channel layer; and doping a second dopant atom inside the first polysilicon channel layer to form a third polysilicon channel layer, wherein the total doping concentration of the first dopant atom and the second dopant atom in the third polysilicon channel layer is larger than the doping concentration of the first dopant atom in the second polysilicon channel layer.

2. The method according to claim 1, wherein the first dopant atom and the second dopant atom are neutral atoms.

3. The method according to claim 2, wherein the first dopant atom and the second dopant atom comprise inert gas and/or the IV A group.

4. The method according to claim 3, wherein the first dopant atom and the second dopant atom respectively are selected from the group consisting of helium (He), neon (Ne), argon (Ar), krypton (Kr), xenon (Xe) and radon (Rn) and any combination thereof.

5. The method according to claim 1, wherein the total doping dose of the first dopant atom and the second dopant atom in the third polysilicon channel layer ranges $10^{11}$~$10^{15}$ atoms/cm$^2$.

* * * * *